United States Patent
Lee et al.

(10) Patent No.: US 12,183,582 B2
(45) Date of Patent: Dec. 31, 2024

(54) FILM DEPOSITION METHOD AND ELEMENT INCLUDING FILM DEPOSITED BY THE FILM DEPOSITION METHOD

(71) Applicant: Samsung Electronics Co., Ltd., Suwon-si (KR)

(72) Inventors: Changseok Lee, Gwacheon-si (KR); Sangwon Kim, Seoul (KR); Keunwook Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 130 days.

(21) Appl. No.: 17/548,997

(22) Filed: Dec. 13, 2021

(65) Prior Publication Data

US 2023/0022023 A1 Jan. 26, 2023

(30) Foreign Application Priority Data

Jul. 22, 2021 (KR) .......................... 10-2021-0096716

(51) Int. Cl.
*H01L 21/285* (2006.01)
*H01L 29/40* (2006.01)

(52) U.S. Cl.
CPC .................. *H01L 21/28556* (2013.01); *H01L 21/28525* (2013.01); *H01L 21/2855* (2013.01); *H01L 21/28568* (2013.01); *H01L 29/401* (2013.01)

(58) Field of Classification Search
CPC ........... H01L 21/0228; H01L 21/02266; H01L 21/0234; H01L 21/002337; H01L 21/02343; H01L 21/76224; H01L 21/76229; H01L 21/28568; H01L 21/28525; H01L 21/76879; H01L 21/76883; H01L 21/0243
See application file for complete search history.

(56) References Cited

U.S. PATENT DOCUMENTS 9,899,258 B1 * 2/2018 Wu .................. H01L 21/76843
10,896,823 B2 1/2021 Seidel et al.
11,069,619 B2 7/2021 Nam et al.
11,180,373 B2 11/2021 Song et al.
(Continued)

FOREIGN PATENT DOCUMENTS

| CN | 106558531 A | 4/2017 |
| KR | 102027776 B1 | 11/2019 |
| KR | 2020/0022009 A | 3/2020 |

OTHER PUBLICATIONS

Hyunwoo Chung et al., 'Novel $4F^2$ Dram Cell with Vertical Pillar Transistor(VPT)' IEEE 2011, pp. 211-214.
(Continued)

*Primary Examiner* — John A Bodnar
(74) *Attorney, Agent, or Firm* — Harness, Dickey & Pierce, P.L.C.

(57) ABSTRACT

A film deposition method may include preparing a non-planar substrate including a first surface, a second surface, and an inclined surface between the first surface and the second surface; depositing a film having a thickness deviation on the first surface, the second surface, and the inclined surface; and etching the film deposited on the first surface, the second surface, and the inclined surface. A height of the second surface may be different than a height of the first surface.

17 Claims, 9 Drawing Sheets

(56) References Cited

U.S. PATENT DOCUMENTS

| | | |
|---|---|---|
| 11,230,764 B2 | 1/2022 | Lehn et al. |
| 2018/0286663 A1* | 10/2018 | Kobayashi .......... H01L 21/0228 |
| 2021/0332479 A1* | 10/2021 | Kim ................. H01L 21/02164 |
| 2022/0278221 A1* | 9/2022 | Zhang ................ H01L 29/7813 |

OTHER PUBLICATIONS

Adrie Mackus, 'Approaches, challenges and opportunities for area-selective ALD' Tutorial ALD 2017 (Technische Universiteit, Eindhoven, University of Technology).

Chun-Li Lo et al., 'Opportunities and challenges of 2D materials in back-end-of-line interconnect scaling' *Journal of Applied Physics*, vol. 128, Aug. 2020, pp. 080903-1-080903-16.

* cited by examiner

FILM DEPOSITION METHOD AND ELEMENT INCLUDING FILM DEPOSITED BY THE FILM DEPOSITION METHOD

CROSS-REFERENCE TO RELATED APPLICATION

This application is based on and claims priority under 35 U.S.C. § 119 to Korean Patent Application No. 10-2021-0096716, filed on Jul. 22, 2021, in the Korean Intellectual Property Office, the disclosure of which is incorporated by reference herein in its entirety.

BACKGROUND

1. Field

The present disclosure relates to a film deposition method and/or an element including a film deposited by the film deposition method.

2. Description of Related Art

As technology advances, the structures of semiconductor elements have been diversified and complicated, and the degree of miniaturization in semiconductor processes has increased. As the degree of integration of semiconductor elements increases, it may be required to deposit a uniform film on a substrate having a high aspect ratio. When a film deposition method of the prior art is applied to a trench structure, overhangs may be formed, and the ratio of a film on a lower portion of a trench and a surface of a substrate or the ratio of a film on a lateral surface of a trench and a surface of a substrate may be lower than an expected value. In addition, depending on process conditions, columnar or porous structures may be formed under overhangs, and voids may be formed inside trenches. In this case, the resistance of wiring may increase or electromigration may occur, thereby resulting in a negative effect on element reliability. Therefore, there is a need for an improved film deposition method.

SUMMARY

Provided are film deposition methods for depositing uniform films.

Provided are elements including films which are deposited by the film deposition methods.

Additional aspects will be set forth in part in the description which follows and, in part, will be apparent from the description, or may be learned by practice of the presented embodiments of the disclosure.

According to an embodiment, a film deposition method may include: preparing a non-planar substrate including a first surface, a second surface, and an inclined surface, where a height of the second surface is different from a height of the first surface and the inclined surface is between the first surface and the second surface; depositing a film having a thickness deviation on the first surface, the second surface, and the inclined surface; and etching the film deposited on the first surface, the second surface, and the inclined surface.

In some embodiments, after the depositing the film, a thickness of the film deposited on the second surface may be greater than a thickness of the film deposited on the first surface, and an etching rate of the film on the second surface may be greater than an etching rate of the film on the first surface.

In some embodiments, etching the film may be terminated when a thickness of the film deposited on the first surface is about 0.5 times to about 1.5 times a thickness of the film deposited on the second surface.

In some embodiments, after the etching the film, a thickness of the film deposited on the first surface and a thickness of the film deposited on the second surface may be equal to each other, or a difference between the thickness of the film deposited on the first surface and the thickness of the film deposited on the second surface may be about 50% or less of the thickness of the film deposited on the first surface.

In some embodiments, after the etching the film, a thickness of the film deposited on the first surface and a thickness of the film deposited on the inclined surface may be equal to each other, or a difference between the thickness of the film deposited on the first surface and the thickness of the film deposited on the inclined surface may be about 50% or less of the thickness of the film deposited on the first surface.

In some embodiments, after the etching the film, the film may have a thickness of about 0.1 nm to about 100 nm on the first surface, the second surface, and the inclined surface.

In some embodiments, the film may include at least one selected from the group consisting of Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, GaSe, $GaTe_2$, $HfS_2$, $HfSe_2$, SnSe, $Pd_5e_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, and $Bi_2O_2Se$.

In some embodiments, the depositing the film may be performed by at least one of atomic layer deposition (ALD), chemical vapor deposition (CVD), physical vapor deposition (PVD), and sputtering, and the etching of the film may include at least one method selected from the group consisting of atomic layer etching (ALE), reactive ion etching (RIE), and plasma etching in which an etching gas is injected.

In some embodiments, the depositing the film and the etching the film may be included in one cycle, and the cycle may be performed a plurality of times.

In some embodiments, after the cycle is performed a plurality of times, a thickness of the film deposited on the first surface and a thickness of the film deposited on the second surface may be equal to each other, or a difference between the thickness of the film deposited on the first surface and the thickness of the film deposited on the second surface may be about 10% or less of the thickness of the film deposited on the first surface.

In some embodiments, the non-planar substrate may include a trench including the first surface and the inclined surface. While the cycle is performed a plurality of times, a trench including the first surface and the inclined surface may be filled with a material.

In some embodiments, the material may include at least one selected from the group consisting of Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, GaSe, $GaTe_2$, $HfS_2$, $HfSe_2$, SnSe, $Pd_5e_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, and $Bi_2O_2Se$.

In some embodiments, the non-planar substrate may include at least one of a trench structure, a pillar structure, and a hollow structure.

In some embodiments, an aspect ratio of the first surface and the inclined surface may be about 1:0.5 to about 1:100.

In some embodiments, according to an embodiment, a film deposition method may include: preparing a substrate including a micropattern; forming a film including a material on the micropattern; and adjusting a thickness of the film to be equal to or less than a given distance from the micropattern.

In some embodiments, the given distance may range from about 0.1 nm to about 100 nm, and after the adjusting the thickness of the film, a ratio of a minimum thickness of the film and a maximum thickness of the film may be within a range of about 0.5 to about 1.5.

In some embodiments, the forming the film may be performed by at least one of atomic layer deposition (ALD), chemical vapor deposition (CVD), physical vapor deposition (PVD), and sputtering, and the adjusting the thickness of the film may be performed by at least one of atomic layer etching (ALE), reactive ion etching (RIE), and plasma etching in which an etching gas based is injected.

In some embodiments, the forming the film and the adjusting the thickness of the film may be included in one cycle, and the cycle may be performed a plurality of times.

In some embodiments, the micropattern may include at least one of a trench structure, a pillar structure, and a hollow structure.

According to an embodiment, a semiconductor element may include: a non-planar substrate; and at least one non-planar film deposited on the non-planar substrate. The at least one non-planar film may have a thickness variation of about 10% or less.

According to an embodiment, a film deposition method may include: preparing a non-planar substrate including a first surface, a second surface and an inclined surface between the first surface and the second surface; and forming a film of a material on the first surface, the second surface, and the inclined surface of the non-planar substrate using a cyclic process. The inclined surface may extend from the first surface to the second surface. Each cycle in the cyclic process may include depositing a deposited film having a thickness deviation between the first surface, the second surface, and the inclined surface; and adjusting the deposited film to provide an adjusted film with a reduced amount of the thickness deviation on the first surface, the second surface, and the inclined surface.

In some embodiments, the depositing the deposited film may be performed by at least one of atomic layer deposition (ALD), chemical vapor deposition (CVD), physical vapor deposition (PVD), and sputtering; the adjusting the deposited film may be performed by at least one of atomic layer etching (ALE), reactive ion etching (RIE), and plasma etching; and the cyclic process may include a plurality of cycles. The deposited film may include a first side contacting the inclined surface and a second side opposite the first side. The adjusted film may include a first sidewall contacting the inclined surface and a second sidewall opposite the first sidewall. A thickness difference between portions of the adjusted film on the first surface and the second surface may be less than a thickness difference between portions of the deposited film on the first surface and the second surface. An angle difference between a direction of the first sidewall and a direction of the second sidewall may be less than an angle difference between a direction of the first side and a direction of the second side, and In some embodiments, the depositing the deposited film may be performed by at least one of atomic layer deposition (ALD), chemical vapor deposition (CVD), physical vapor deposition (PVD), and sputtering; the adjusting the deposited film may be performed by at least one of atomic layer etching (ALE), reactive ion etching (RIE), and plasma etching; and the cyclic process may include a plurality of cycles. A thickness difference between portions of the adjusted film on the first surface and the second surface may be less than a thickness difference between portions of the deposited film on the first surface and the second surface. A difference between minimum and maximum thicknesses of the adjusted film along the inclined surface may be less than a difference between minimum and maximum thicknesses of the deposited film along the inclined surface.

In some embodiments, the non-planar substrate may include a trench structure including the first surface at a bottom of the trench structure, the second surface at a top of the trench structure, and the inclined surface along a first sidewall of the trench structure and a second sidewall of the trench structure. The forming the film may provide the film covering the first surface, the second surface, the first sidewall of the trench structure, and the second sidewall of the trench structure. The depositing the deposited film may be performed by at least one of atomic layer deposition (ALD), chemical vapor deposition (CVD), physical vapor deposition (PVD), and sputtering. The adjusting the deposited film may be performed by at least one of atomic layer etching (ALE), reactive ion etching (RIE), and plasma etching. The cyclic process may include a plurality of cycles. A separation distance in the trench between parts of the adjusted film covering the first sidewall of the trench structure and the second sidewall of the trench structure may have less variation than a variation of a separation distance in the trench between portions of the deposited film covering the first sidewall of the trench structure and the second sidewall of the trench structure.

In some embodiments, the material may include at least one selected from the group consisting of Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, $GaSe$, $GaTe_2$, $HfS_2$, $HFSe_2$, $SnSe$, $Pd_Se_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, and $Bi_2O_2Se$.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
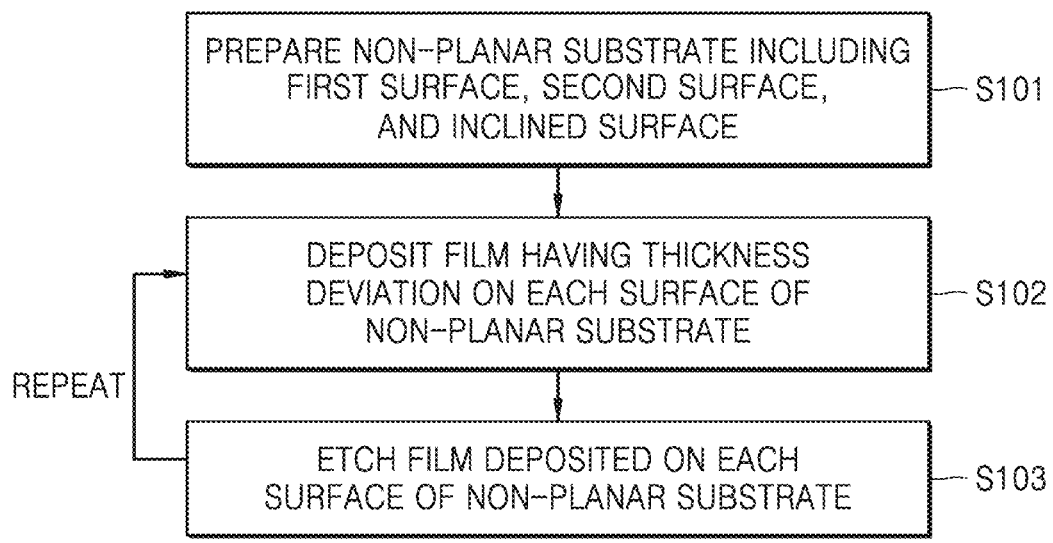
FIG. 1 is a flowchart illustrating a film deposition method according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value include a tolerance of +/−10% around the stated numerical value. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described with reference to the accompanying drawings. The embodiments described herein are for illustrative purposes only, and various modifications may be made therein. In the drawings, like reference numerals refer to like elements, and the sizes of elements may be exaggerated for clarity of illustration.

It will also be understood that when an element is referred to as being "on," "below," or "above" another element, the element may be in direct contact with the other element or other intervening elements may be present.

The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form.

The meaning of "connection" may include not only a physical connection, but also optical connection, electrical connection, and the like.

In addition, examples or example terms (for example, "such as" and "etc.") are used for the purpose of description and are not intended to limit the scope of the present disclosure unless defined by the claims.

It will be understood that although terms such as "first" and "second" are used herein to describe various elements, these elements should not be limited by these terms. Terms are only used to distinguish one element from other elements.

When a length such as a height, a depth, or a thickness is referred to as being the same as another length, there may be a difference between the lengths within an error range acceptable by those of ordinary skill in the art.

Figure 2:
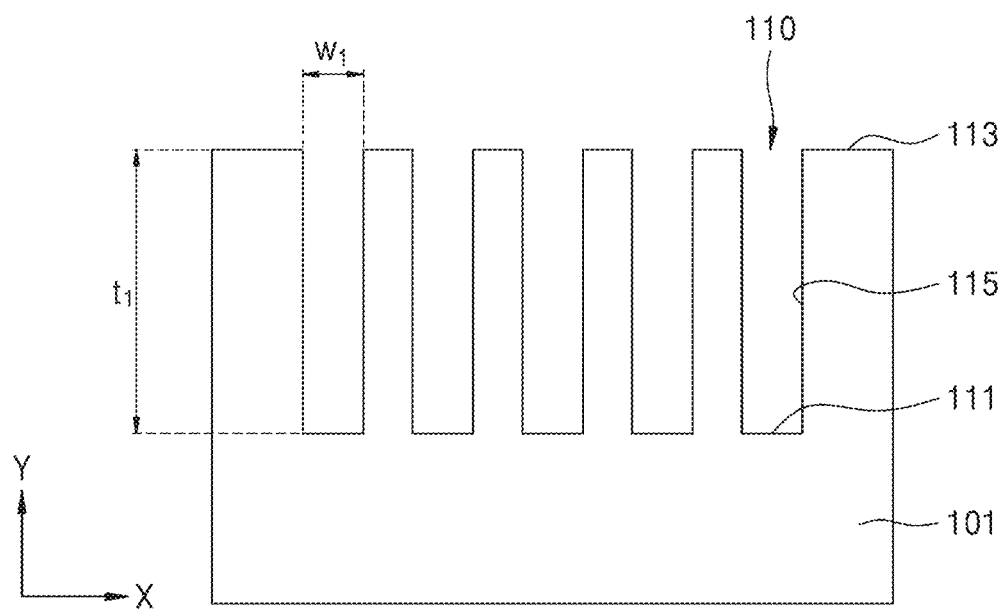
FIG. 2 is a cross-sectional view illustrating a non-planar substrate having a trench structure in the film deposition method according to an example embodiment.
Figure 3:
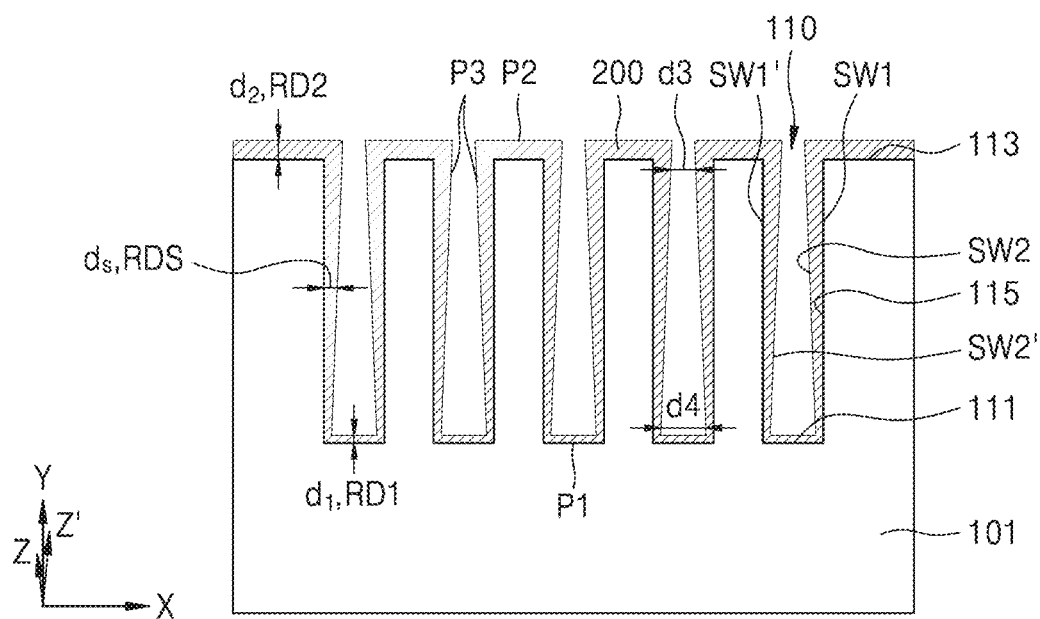
FIG. 3 is a cross-sectional view illustrating a deposition operation in the film deposition method according to an example embodiment.
Figure 4:
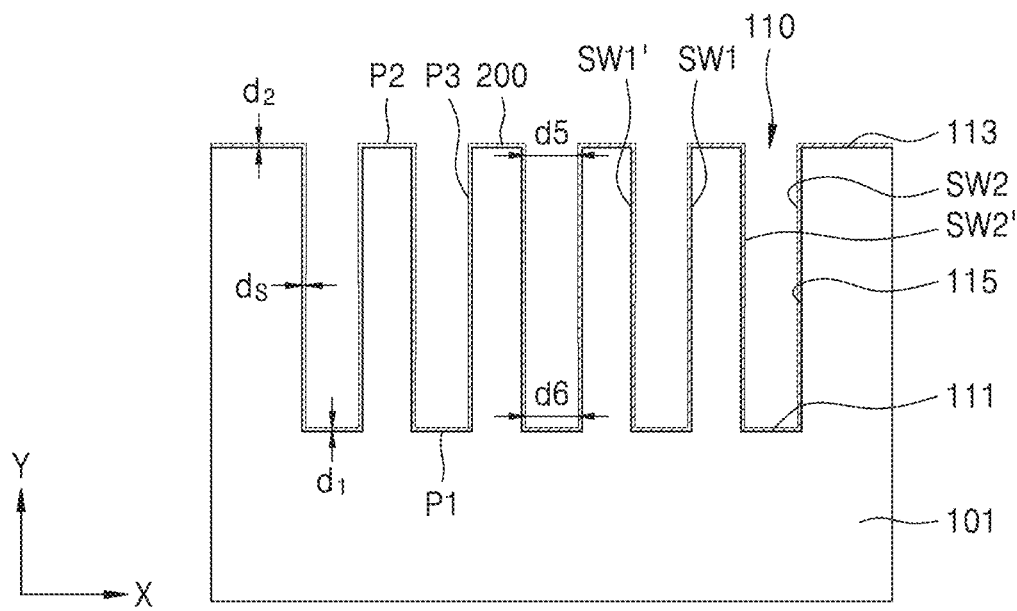
FIG. 4 is a cross-sectional view illustrating an etching or adjusting operation in the film deposition method according to an example embodiment.

FIG. 1 is a flowchart illustrating a film deposition method according to an example embodiment, FIG. 2 is a cross-sectional view illustrating a non-planar substrate having a trench structure in the film deposition method according to an example embodiment; FIG. 3 is a cross-sectional view illustrating a deposition operation in the film deposition method according to an example embodiment; and FIG. 4 is a cross-sectional view illustrating an etching or adjusting operation in the film deposition method according to an example embodiment.

Referring to FIGS. 1 to 4, according to example embodiments, the film deposition method may include: an operation S101 of preparing a non-planar substrate 101 having a first surface 111, a second surface 113 at a height different from the height of the first surface 111, and an inclined surface 115 between the first surface 111 and the second surface 113; a deposition operation S102 of depositing a film 200 having a thickness deviation on the first surface 111, the second surface 113, and the inclined surface 115; and an etching operation S103 of etching the film 200 deposited on the first surface 111, the second surface 113, and the inclined surface 115 to reduce the thickness deviation of the film 200. According to the film deposition method of example embodiments, the thickness deviation of the film 200 deposited on the first surface 111, the second surface 113, and the inclined surface 115 may be reduced such that the film 200 may be uniformly formed on the non-planar substrate 101. In particular, a cycle including the deposition operation S102 and the etching operation S103 may be performed two or more times to adjust the thickness of the film 200 on the first surface 111 and the thickness of the film 200 on the second surface 113 to be substantially equal to each other, or the ratio of the thicknesses thereof to be about 1. According to the film deposition method of example embodiments, the film 200 may be uniformly formed on the non-planar substrate 101 by using a deposition rate and an etching rate according to the height difference between the first surface 111 and the second surface 113 of the non-planar substrate 101.

Referring to FIGS. 1 and 2, the film deposition method of example embodiments may include the operation S101 for preparing the non-planar substrate 101, which includes the first surface 111, the second surface 113 having a height different from the height of the first surface 111, and the inclined surface 115 between the first surface 111 and the second surface 113. The first surface 111 and the second surface 113 may extend in the first direction X, but example embodiments are not limited thereto. Alternatively, the first surface 111 and the second surface 113 may extend in different directions from each other.

The inclined surface 115 may cross the first direction X. The inclined surface 115 may extend from the first surface 111 to the second surface 113. Although not illustrated, in some embodiments, the inclined surface 115 may be spaced apart from the first surface 111 and/or the second surface 113.

The non-planar substrate 101 may refer to a substrate in which at least one surface has a different height than another surface. The non-planar substrate 101 may include a microstructure. The microstructure may include at least one protrusion and/or at least one trench.

Referring to FIGS. 1 to 4, the non-planar substrate 101 may be a non-planar substrate 101 having a trench structure. The first surface 111 may be lower than the second surface 113. For example, the non-planar substrate 101 may have an engraved structure including a plurality of trenches or an embossed structure including a plurality of protrusions. However, the non-planar substrate 101 is not limited thereto and may have various inclined pattern structures. The embossed structure including a plurality of protrusions may include trenches between the plurality of protrusions. For example, the engraved structure including a plurality of trenches may include a trench structure, and the embossed structure including a plurality of protrusions may include a pillar structure or a hollow structure. However, these are non-limiting examples, and the embossed structure including a plurality of protrusions may also have trenches formed by the plurality of protrusions.

According to example embodiments, the non-planar substrate 101 may include a pattern having an inclination angle of about 90 degrees. However, the non-planar substrate 101 is not limited thereto and may include a structure or pattern having an inclined surface 115, which has an inclination angle of about 90 degrees or less, or about 90 degrees or more. For example, the trench structure may include trenches 110, wherein the bottom surfaces of the trenches 110 may be referred to as the first surface 111, lateral surfaces of the trenches 110 may be referred to as the inclined surface 115, and the upper surface of the non-planar substrate 101 having the trenches may be referred to as the second surface 113. For example, in the pillar structure, the bottom surfaces of trenches 110 between pillars may be referred to as the first surface 111, lateral surfaces of the pillars may be referred to as the inclined surface 115, and the upper surfaces of the pillars may be referred to as the second surface 113.

For example, the non-planar substrate 101 may have a trench structure including a plurality of trenches 110. The plurality of trenches 110 may have the same size or different sizes. When one of the plurality of trenches 110 has a width $W_1$ and a height ti, an aspect ratio may be defined as $t_1/W_1$. For example, the aspect ratio may be within the range of about 0.5 to about 100. In particular, the film deposition method of example embodiments may be used for a substrate having a high aspect ratio. Here, the high aspect ratio may be within the range of about 2 or more (e.g., 2 to 100). However, the trenches 110 are not limited to this aspect ratio and may have various shapes and aspect ratios. Due to the characteristics of the non-planar substrate 101, the rate of deposition and the rate of etching may vary according to the height of the trenches 110.

Referring to FIGS. 1 and 3, the film deposition method of example embodiment may include the deposition operation S102 for depositing the film 200 on the first surface 111, the second surface 113, and the inclined surface 115. The film 200 may be entirely deposited on a non-planar side of the non-planar substrate 101. For example, the film 200 may be entirely deposited on the first surface 111, the second surface 113, and the inclined surface 115 of the non-planar substrate 101, which has a trench structure. The deposition operation S102 may include atomic layer deposition (ALD), chemical vapor deposition (CVD), physical vapor deposition (PVD), sputtering, or the like. For example, the film 200 may be deposited on the non-planar substrate 101 by ALD. For example, in the non-planar substrate 101 having a trench structure, the first surface 111 may refer to the bottom surfaces of the trenches 110, the second surface 113 may refer to the upper surface of the non-planar substrate 101, and the inclined surface 115 may refer to the lateral surfaces of the trenches 110.

A deposition rate RD1 on the first surface 111, a deposition rate RD2 on the second surface 113, and the deposition rate RDS on the inclined surface 115 may be different from each other. The rate of deposition may decrease as the distance from the second surface 113 increases or the depth of the trench 110 increases. The deposition rate RD1 on the first surface 111 may be less than the deposition rate RD2 on the second surface 113. In addition, the deposition rate RDS on the inclined surface 115 may range between the deposition rate RD1 on the first surface 111 and the deposition rate RD2 on the second surface 113. That is, the deposition rate RDS on the inclined surface 115 may approach the deposition rate RD1 on the first surface 111 in a direction toward the first surface 111 and may approach the deposition rate RD2 on the second surface 113 in a direction toward the second surface 113. Because the rate of deposition varies depending on the first surface 111, the second surface 113, and the inclined surface 115, the film 200 deposited through the deposition operation S102 may have different thicknesses, that is, thickness deviation, on the first surface 111, the second surface 113, and the inclined surface 115. The thickness $d_1$ of the film 200 on the first surface 111 may be less than the thickness $d_2$ of the film 200 on the second surface 113. The thickness $d_S$ of the film 200 on the inclined surface 115 may be between the thickness $d_1$ and the thickness $d_2$. The deposition operation S102 may be terminated before the thickness $d_2$ reaches half of the width $W_1$ of trench 110.

As shown in FIG. 3, the thickness $d_s$ of the film 200 may vary in a height direction from the first surface 111 to the second surface 113. The film 200 formed after the deposition operation (S102 in FIG. 1) may be referred to a deposited film 200. The film 200 may include a first portion P1 on the first surface 111, a second portion P2 on the second surface 113, and a third portion P3 on the inclined surface 115. The thickness $d_s$ may increase from a minimum thickness $d_s$ at a first region (e.g., near the first surface 111 at the bottom of the trench 110) to a maximum thickness $d_s$ at a second region (e.g., near the second surface 113 at the top of the trench 110).

The film 200 may include a first side SW1 (and/or SW1') contacting the inclined surface 113 and a second side SW2 (and/or SW2') opposite the first side SW1 (and/or SW1'). The film 200 may have a variation in thickness $d_s$ along the inclined surface 115. For example, as shown in FIG. 3, the film 200 may be thicker near the second surface 113 than near the first surface 111. As shown in FIG. 3, a separation distance d4 between portions film 200 at a bottom region of the trench 110 may be greater than a separation distance d3 at a top region of the trench 110.

The film 200 covering the non-planar substrate 101 may include various materials. For example, the film 200 may include Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, GaSe, $GaTe_2$, $HfS_2$, $HFSe_2$, SnSe, $Pd_se_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, $Bi_2O_2Se$, or the like.

Referring to FIGS. 1 and 4, the film deposition method of example embodiments may include an operation of adjusting the thickness $d_1$ of the film 200 deposited on the first surface 111, the thickness $d_2$ of the film 200 deposited on the second surface 113, and the thickness $d_S$ of the film 200 deposited on the inclined surface 115. In the adjusting operation, the thicknesses $d_1$, $d_2$, and $d_S$ of the film 200 on the first surface 111, the second surface 113, and the inclined surface 115 may be adjusted to be equal to or less than a desired and/or alternatively predetermined distance from the non-planar substrate 101 or the microstructure of the non-planar substrate 101. The film 200 may be referred to as an adjusted film 200 after the adjusting operation.

The adjusting operation may include the etching operation S103 in which the film 200 deposited on the first surface 111, the second surface 113, and the inclined surface 115 is etched, and thus, the thickness deviation of the film 200 deposited on the first surface 111, the second surface 113, and the inclined surface 115 may be reduced. Etching of the film 200 may be entirely performed on the non-planar side of the substrate. For example, etching of the film 200 may be entirely performed on the first surface 111, the second surface 113, and the inclined surface 115 of the non-planar substrate 101 having a trench structure. The etching operation S103 may include atomic layer etching (ALE), reactive ion etching (RIE), plasma etching in which an etching gas based on general CVD is injected, or the like. An etching rate RE1 on the first surface 111, an etching rate RE2 on the second surface 113, and an etching rate RES on the inclined surface 115 may be different from each other.

As the distance from the second surface 113 or the depth of the trench 110 increases, the etching rate RES on the inclined surface 115 may decrease. The etching rate RE1 on the first surface 111 may be less than the etching rate RE2 on the second surface 113. The etching rate RES on the inclined surface 115 may vary according to the height of the inclined surface 115 and may range between the etching rate RE1 on the first surface 111 and the etching rate RE2 on the second surface 113. The etching rate RES on the inclined surface 115 may approach the etching rate RE1 on the first surface 111 in a direction toward the first surface 111 and may approach the etching rate RE2 on the second surface 113 in a direction toward the second surface 113. The deposition rate RD1 on the first surface 111 may be greater than the etching rate RE1 on the first surface 111, and the deposition rate RE2 on the second surface 113 may be equal to or similar to the etching rate RD2 on the second surface 113. Therefore, the film 200 may be uniformly deposited or formed by performing the etching operation S103 on the first surface 111, the second surface 113, and the inclined surface 115 according to the difference between the deposition rate and the etching rate on each surface.

Owing to different etching rates on the first surface 111 and the second surface 113, the thickness $d_1$ of the film 200 on the first surface 111 and the thickness $d_2$ of the film 200 on the second surface 113 may be uniformly adjusted. While the film 200 on the second surface 113 is being etched, the film 200 on the first surface 111 may also be etched. After the deposition operation S102 but before the etching operation S103, the thickness $d_2$ of the film 200 on the second surface 113 may be greater than the thickness $d_1$ of the film 200 on the first surface 111.

Because the etching rate RE2 on the second surface 113 is greater than the etching rate RE1 on the first surface 111, the difference between the thickness $d_2$ of the film 200 on the second surface 113 and the thickness $d_1$ of the film 200 on the first surface 111 may gradually decrease while etching is performed on the first surface 111 and the second surface 113, and as a result, the thickness difference may disappear or decrease to a very small value. For example, when the thickness $d_1$ of the film 200 on the first surface 111 is about 0.5 times to about 1.5 times the thickness $d_2$ of the film 200 on the second surface 113, the etching operation S103 may be terminated. Alternatively, the thickness $d_1$ of the film 200 on the first surface 111 is about 0.7 times to about 1.3 times the thickness $d_2$ of the film 200 on the second surface 113, the etching operation S103 may be terminated.

After the etching operation S103, a bottom coverage ($d_1/d_2$) between lower portions of the trenches 110 (or the first surface 111) and the upper surface of the non-planar substrate 101 (or the second surface 113) may be within the range of about 0.5 to about 1.5. Alternatively, the bottom coverage may be within the range of about 0.7 to about 1.3. In addition, the thickness $d_S$ of the film 200 on the inclined surface 115 may range between the thickness $d_1$ of the film 200 on the first surface 111 and the thickness $d_2$ of the film 200 on the second surface 113. In this case, a step coverage ($d_S/d_2$) between the lateral surfaces of the trenches 110 (or the inclined surface 115) and the upper surface of the non-planar substrate 101 (or the second surface 113) may be within the range of about 0.5 to about 1.5. Alternatively, the step coverage may be within the range of about 0.7 to about 1.3.

Here, the thickness $d_S$ of the film 200 on the inclined surface 115 may be adjusted to result in states such as: a state in which the thickness $d_S$ of the film 200 on the inclined surface 115 is substantially constant; or a state in which the thickness $d_S$ of the film 200 on the inclined surface 115 continuously varies within a small range between the thickness $d_1$ of the film 200 on the first surface 111 and the thickness $d_2$ of the film 200 on the second surface 113 because the thickness $d_1$ and the thickness $d_2$ are substantially equal to each other or are slightly different from each other. For example, when the thickness $d_1$ of the film 200 on the first surface 111 is about 0.9 times to about 1.1 times the thickness $d_2$ of the film 200 on the second surface 113, the etching operation S103 may be terminated. In this case, the bottom coverage may range from about 0.9 to about 1.1, and the step coverage may range from about 0.9 to about 1.1.

The film 200 deposited by the film deposition method of example embodiments may have a thickness of about 0.1 nm to about 100 nm on the first surface 111, the second surface 113, and the inclined surface 115. In this case, the thickness of the film 200 covering the first surface 111, the second surface 113, and the inclined surface 115 may have a uniform thickness on each surface or at least two or more surfaces. After depositing the film 200, the thickness of the film 200 may be adjusted by etching or the like to limit and/or prevent the formation of structures such as overhangs, columnar blades, or porous structures which affect electrical properties, or reduce the probability of formation of such structures. Therefore, when the film deposition method of example embodiments is used for manufacturing elements, the elements may have satisfactory electrical characteristics and high reliability.

The deposition operation S102 and the etching operation S103 described above may constitute one cycle, and the cycle may be performed once or a plurality of times. A film, which has a bottom coverage and/or a step coverage close to 1, may be deposited or formed by performing the cycle a plurality of times. The deposition rate RD1 on the first surface 111 may be greater than the etching rate RE1 on the first surface 111. The deposition rate RD1 on the first surface 111 may be less than the deposition rate RD2 on the second surface 113. The etching rate RE2 on the second surface 113 may be equal to or similar to the deposition rate RD2 on the second surface 113. Based on this relationship, the cycle of the deposition operation S102 and the etching operation S103 may be performed a plurality of times to gradually reduce the difference between the thickness $d_1$ of the film 200 on the first surface 111 and the thickness $d_2$ of the film 200 on the second surface 113 such that the thickness of the film 200 may be substantially uniform. Therefore, according to the film deposition method of example embodiments, the film 200 having a desired and/or alternatively predetermined thickness may be deposited by performing the cycle a plurality of times.

In addition, the thickness $d_1$ of the film 200 on the first surface 111 and the thickness $d_2$ of the second surface 113 may be adjusted by performing the cycle a plurality of times. When the thickness $d_1$ of the film 200 on the first surface 111 and the thickness $d_2$ of the film 200 on the second surface 113 obtained through one cycle are less than a desired thickness, the cycle may be performed a plurality of times to increase the thickness $d_1$ of the film 200 on the first surface 111 and the thickness $d_2$ of the film 200 on the second surface 113.

Referring to FIGS. 1, 3, and 4, a thickness difference between portions of the film 200 in FIG. 4 on the first surface 111 and the second surface 113 after the adjusting operation (e.g., etching operation S103) may be less than a thickness difference between portions of the film 200 in FIG. 3 on the first surface 111 and the second surface 113 after the deposition operation S102. A difference between minimum and maximum thicknesses $d_s$ of the film 200 along the inclined surface 115 may be less in the film 200 after the adjusting operation (e.g., etching operation S103), as shown in FIG. 4, compared to a difference between minimum and maximum thicknesses $d_s$ of the film 200 after the deposition operation S102 and before the adjusting operation.

As shown by a comparison of the film 200 in FIGS. 3 and 4, an angle difference between a direction of the first sidewall SW1 (or SW1') and a direction of the second sidewall SW2 (or SW2') may be reduced after performing the adjusting operation (e.g., etching operation S103). For example, as shown in FIG. 3, the first sidewall SW1 (or SW1') of the film 200 may extend in the second direction Y and the second sidewall SW2 (or SW2') of the film 200 may extend in a third direction Z (or Z') that is different than the second direction Y. However, after the adjusting operation, as shown in FIG. 4, the first sidewall SW1 (or SW1') and the second sidewall SW2 (or SW2') may extend in the second direction Y. As shown in FIG. 4, separation distances d5 and d6 between portions film 200 at the top and bottom regions of the trench 110, respectively, may have smaller difference after the adjusting operation than the separation distances d3 and d4 in FIG. 3 between portions of the film 200 at the top and bottom regions of the trench 100 after the deposition operation S102.

Figure 5:
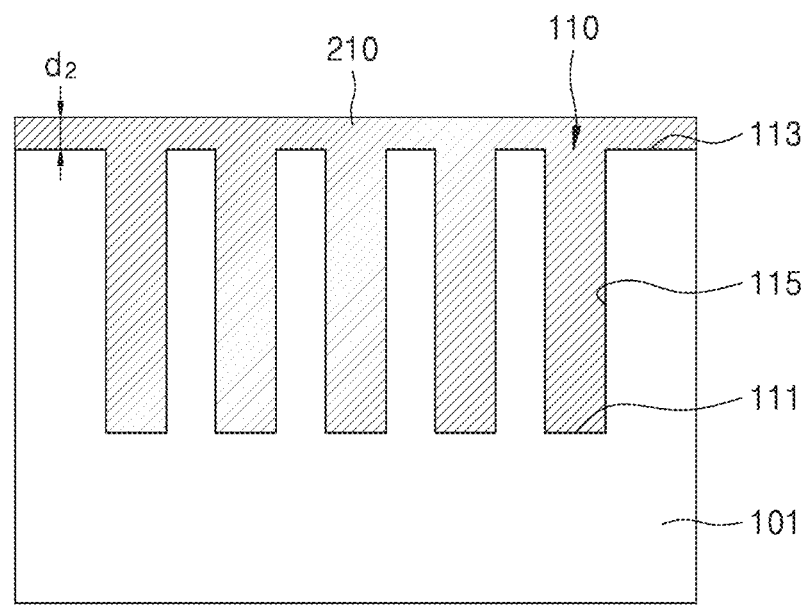
FIG. 5 is a cross-sectional view illustrating trenches of the non-planar substrate which are filled by performing the film deposition method for a plurality of cycles according to an example embodiment.

FIG. 5 is a cross-sectional view illustrating a state in which the trenches 110 of the non-planar substrate 101 are filled by performing the cycle of the film deposition method a plurality of times according to an example embodiment.

In some cases, the cycle may be performed a plurality of times to completely fill the insides of the trenches 110 of the non-planar substrate 101. When the insides of the trenches 110 are filled through one deposition operation, structures such as overhangs, which deteriorate electrical characteristics, may be formed. When the entrances of trenches 110 having overhangs are blocked, voids may be formed. Such voids may increase the resistance of wiring or cause electromigration, and thus, the formation of elements may be negatively affected.

The trenches 110 may be filled a plurality of times with a material 210 by performing the cycle of the film deposition method a plurality of times according to an example embodiment, and thus, the formation of voids in the trenches 110 may be prevented or reduced.

Referring to FIG. 5, while the cycle is performed a plurality of times, the film thicknesses $d_1$, $d_2$, and $d_S$ of the material 210 deposited on the first surface 111, the second surface 113, and the inclined surface 115 may gradually increase. Because the deposition operation S102 and the etching operation S103 are performed a plurality of times, voids may not be formed, or the formation of voids may be reduced. In this manner, the trenches 110 of the non-planar substrate 101 may be filled with the material 210. The trenches 110 of the non-planar substrate 101 may be filled with various materials by performing the cycle a plurality of times. Examples of the material 210 may include Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, $GaSe$, $GaTe_2$, $HfS_2$, $HFSe_2$, $SnSe$, $Pd_Se_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, $Bi_2O_2Se$, etc.

After filling the insides of the trenches 110 of the non-planar substrate 101, a portion of the material 210 formed on the upper surface (or the second surface 113) of the non-planar substrate 101 may be removed or may not be removed.

Figure 6:
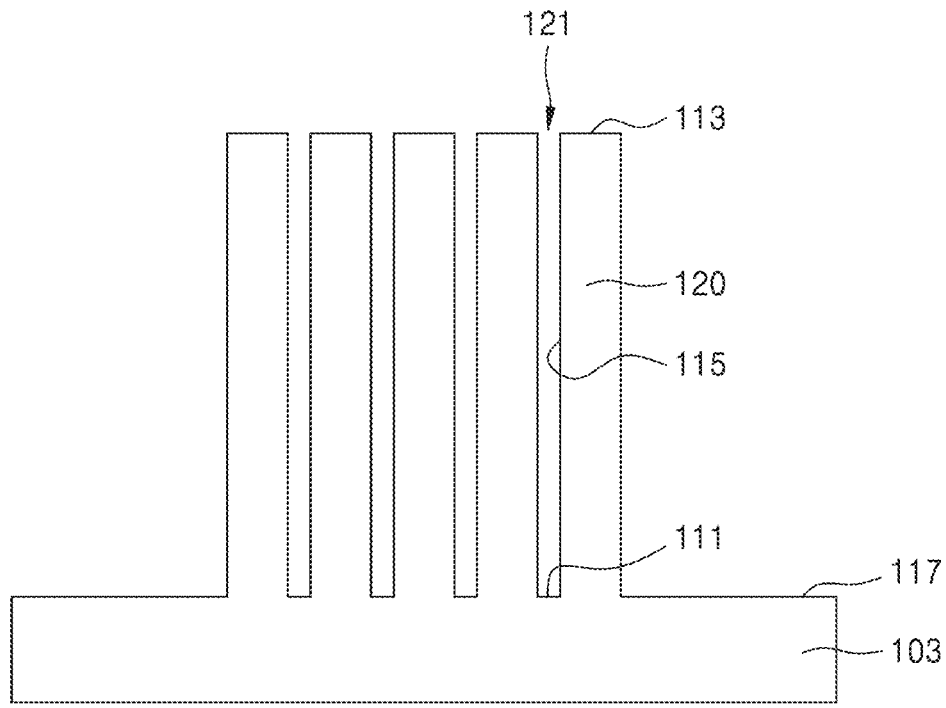
FIG. 6 is a cross-sectional view illustrating a non-planar substrate having a pillar structure in a film deposition method according to an example embodiment.
Figure 7:
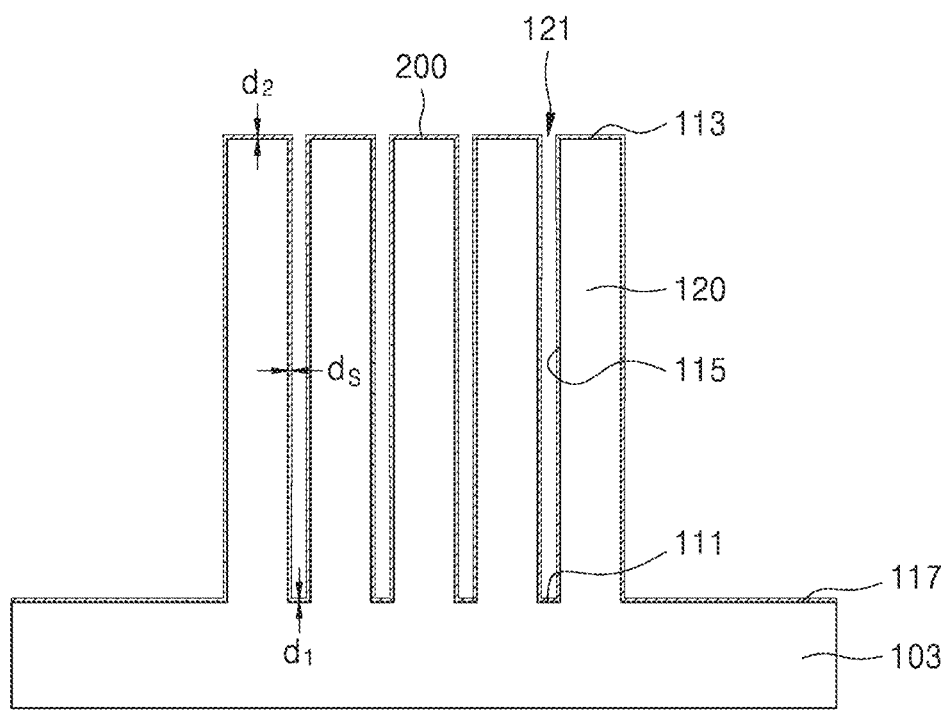
FIG. 7 is a cross-sectional view illustrating a film which is deposited on the non-planar substrate having a pillar structure by the film deposition method according to an example embodiment.

FIG. 6 is a cross-sectional view illustrating a non-planar substrate 103 having a pillar structure in a film deposition method according to an example embodiment, and FIG. 7 is a cross-sectional view illustrating a film 200 which is deposited on the non-planar substrate 101 having a pillar structure by the film deposition method according to an example embodiment.

Referring to FIGS. 6 and 7, the film 200 may be deposited or formed on the non-planar substrate 103 having a pillar structure in the same manner as the non-planar substrate 101 having a trench structure. The pillar structure may include a plurality of protrusions 120, and one or more trenches 121 may be formed between the protrusions 120. The bottom surfaces of the trenches 121 between the protrusions 120 may be referred to as a first surface 111, the upper surfaces of the protrusions 120 may be referred to as a second surface 113, and lateral surfaces of the trenches 121 between the protrusions 120 may be referred to as an inclined surface 115. A bottom surface formed outside the protrusions 120 may be referred to as a third surface 117. The third surface 117 may have the same height as the first surface 111 or may have a height different from the height of the first surface 111. In a deposition operation S102, the film 200 may be deposited on the first surface 111, the second surface 113, the third surface 117, and the inclined surface 115. Deposition may occur at different rates on the first surface 111, the second surface 113, the third surface 117, and the inclined surface 115.

In an etching or adjusting operation S103, the film 200 deposited on the first surface 111, the second surface 113, the third surface 117, and the inclined surface 115 may be partially etched. The etching operation S103 may be formed at different rates on the first surface 111, the second surface 113, the third surface 117, and the inclined surface 115. In this case, when the third surface 117 has a certain length or more, the deposition rate on the second surface 113 and the deposition rate on the third surface 117 may be approximately equal to each other, and the etching rate on the second surface 113 and the etching rate on the third surface 117 may be approximately equal to each other.

In an example, when the thickness $d_1$ of the film 200 on the first surface 111 is about 0.5 times to about 1.5 times the thickness $d_2$ of the film 200 on the second surface 113, the etching operation S103 may be terminated. In another example, when the thickness $d_1$ of the film 200 on the first surface 111 is about 0.7 times to about 1.3 times the thickness $d_2$ of the film 200 on the second surface 113, the etching operation S103 may be terminated. In another example, when the thickness $d_1$ of the film 200 on the first surface 111 is about 0.9 times to about 1.1 times the thickness $d_2$ of the film 200 on the second surface 113, the etching operation S103 may be terminated. For example, when the difference between the thickness $d_1$ of the film 200 on the first surface 111 and the thickness $d_2$ of the film 200 on the second surface 113 is small within the above-mentioned ranges, the etching operation S103 may be terminated.

The film 200 may be uniformly deposited even on the non-planar substrate 103 having a pillar structure through the deposition operation S102 and the etching operation S103. Alternatively, a cycle including the deposition operation S102 and the etching operation S103 may be performed a plurality of times to adjust the bottom coverage of the film 200 and/or the step coverage of the film 200 to be close to 1, or to increase the thickness of the film 200 to a desired and/or alternatively predetermined value. In addition, the trenches 121 formed between the protrusions 120 may be filled with a material by performing the cycle a plurality of times.

Figure 8:
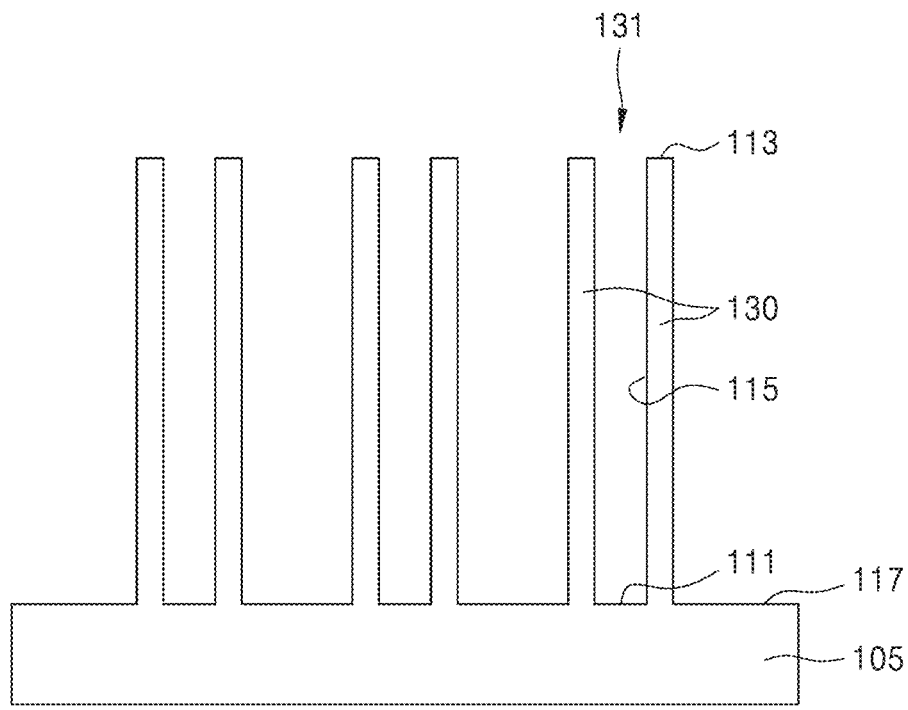
FIG. 8 is a cross-sectional view illustrating a non-planar substrate having a hollow structure in a film deposition method according to an example embodiment.
Figure 9:
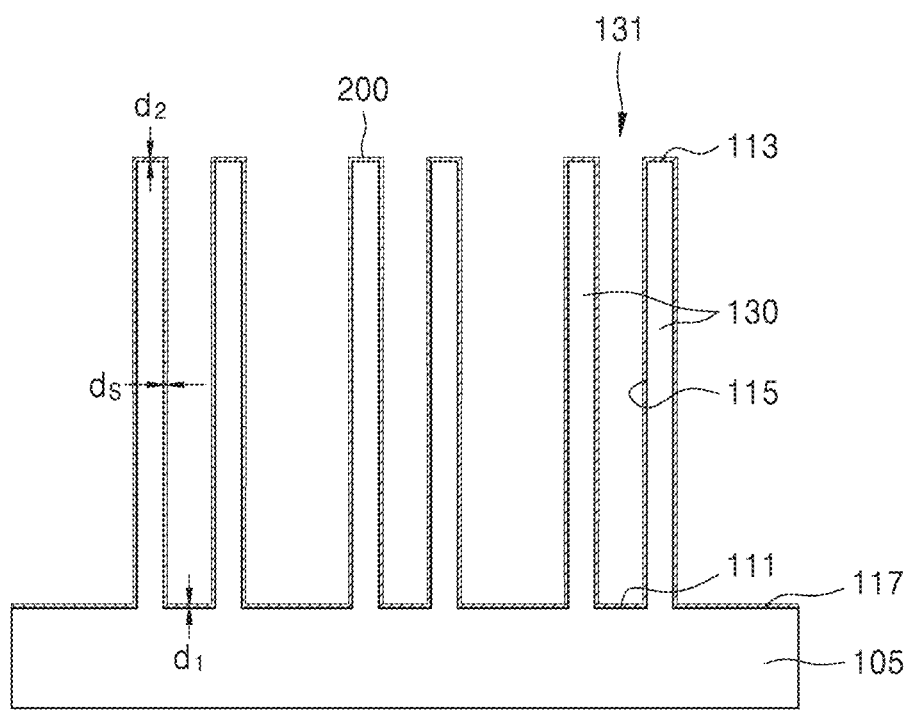
FIG. 9 is a cross-sectional view illustrating a film which is deposited on the non-planar substrate having a hollow structure by the film deposition method according to an example embodiment.

FIG. 8 is a cross-sectional view illustrating a non-planar substrate 105 having a hollow structure, and FIG. 9 is a cross-sectional view illustrating a film 200 which is deposited on the non-planar substrate 105 having a hollow structure 130 by a film deposition method according to an example embodiment.

Referring to FIGS. 8 and 9, the film 200 may be deposited or formed on the non-planar substrate 105 having a hollow structure 130 in the same manner as the non-planar substrate 101 having a trench structure. A plurality of hollow structures 130 may be arranged, and one or more trenches 131 may be formed between the hollow structures 130. The bottom surfaces of the trenches 131 between the hollow structures 130 may be referred to as a first surface 111. The upper surfaces of the hollow structures 130 may be referred to as a second surface 113. Lateral surfaces of the trenches 131 between the hollow structures 130 may be referred to as an inclined surface 115. A bottom surface formed outside the hollow structures 130 may be referred to as a third surface 117. The third surface 117 may have the same height as the first surface 111 or may have a height different from the height of the first surface 111. In a deposition operation S102, the film 200 may be deposited on the first surface 111, the second surface 113, the third surface 117, and the inclined surface 115. Deposition may occur at different rates on the first surface 111, the second surface 113, the third surface 117, and the inclined surface 115.

In an adjusting (etching) operation S103, the film 200 deposited on the first surface 111, the second surface 113, the third surface 117, and the inclined surface 115 may be partially etched. In this case, etching may be performed at different rates on the first surface 111, the second surface 113, the third surface 117, and the inclined surface 115. In this case, when the third surface 117 has a certain length or more, the deposition rate on the second surface 113 and the deposition rate on the third surface 117 may be approximately equal to each other, and the etching rate on the second surface 113 and the etching rate on the third surface 117 may be approximately equal to each other.

In an example, when the thickness $d_1$ of the film 200 on the first surface 111 is about 0.5 times to about 1.5 times the thickness $d_2$ of the film 200 on the second surface 113, the etching operation S103 may be terminated. In another example, when the thickness $d_1$ of the film 200 on the first surface 111 is about 0.7 times to about 1.3 times the thickness $d_2$ of the film 200 on the second surface 113, the etching operation S103 may be terminated. In another example, when the thickness $d_1$ of the film 200 on the first surface 111 is about 0.9 times to about 1.1 times the thickness $d_2$ of the film 200 on the second surface 113, the etching operation S103 may be terminated. For example, when the difference between the thickness $d_1$ of the film 200 on the first surface 111 and the thickness $d_2$ of the film 200 on the second surface 113 is small within the above-mentioned ranges, the etching operation S103 may be terminated.

The film 200 may be uniformly deposited even on the non-planar substrate 105 having the hollow structures 130 through the deposition operation S102 and the etching operation S103. Alternatively, a cycle including the deposition operation S102 and the etching operation S103 may be performed a plurality of times to adjust the bottom coverage of the film 200 and/or the step coverage of the film 200 to be close to 1, or to increase the thickness of the film 200 to a desired and/or alternatively predetermined value. In addition, the trenches 131 formed between the hollow structures 130 may be filled with a material by performing the cycle a plurality of times.

When a film deposition method of the prior art is applied to a non-planar substrate, overhang structures may be formed. In this case, the bottom coverage of a film deposited on the non-planar substrate, which is the ratio of the film on a lower portion of a trench to the film on a surface of the non-planar substrate, may be less than about 1. Also, when a film deposition method of the prior art is applied to a non-planar substrate, the step coverage of the film, which is the ratio of the film on an inclined surface of the trench to the film on the surface of the non-planar substrate, may be less than about 1. In addition, depending on process conditions, columnar structures or porous structures may be formed under the overhang structures, and thus, electrical characteristics may be negatively affected. According to the film deposition methods of example embodiments, the deposition operation S102 and the etching operation S103 (e.g., a thickness adjusting operation by etching or the like) may be performed one or more times to deposit a film 200 on a non-planar substrate having various structures while preventing or reducing the formation of overhands, columnar structures, and/or porous structures, and deterioration in element characteristics.

In addition, according to the film deposition methods of example embodiments, a film may be deposited on the entire non-planar upper portion of a substrate rather than selectively depositing a film on a limited specific portion of a non-planar surface of a substrate, thereby increasing the processing rate of an element manufacturing process.

The film deposition methods of example embodiments may be used for manufacturing various elements including non-planar substrates, such as semiconductor elements. For example, the film deposition methods may be used for manufacturing elements such as dynamic random-access memory (DRAM) cell transistors, vertical DRAMs, 3D-NAND flash Memories, DRAM capacitors, interconnects, vias, capacitors, transistors, or the like. Such various elements including semiconductor elements may include at least one film deposited by any of the film deposition methods of example embodiments. The film may be a non-planar film deposited on a non-planar substrate. In addition, the film deposited on various elements including semiconductor elements may have a thickness deviation of about 10% or less.

For example, FIGS. 10A to 10E illustrate semiconductor elements according to some example embodiments.

Figure 10A:
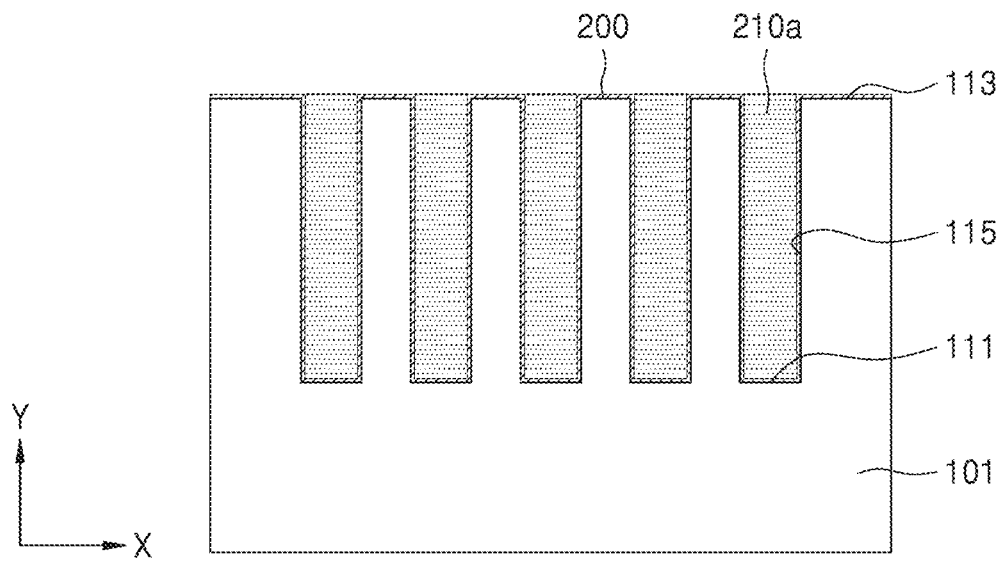
FIGS. 10A to 10E illustrate semiconductor elements according to some example embodiments.
Figure 10B:
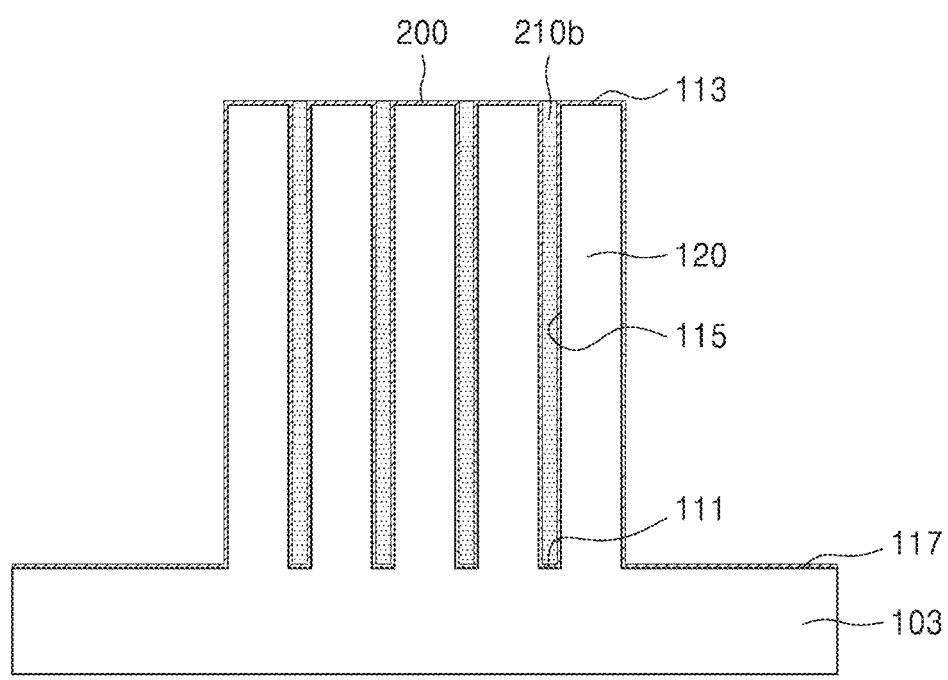
Figure 10C:
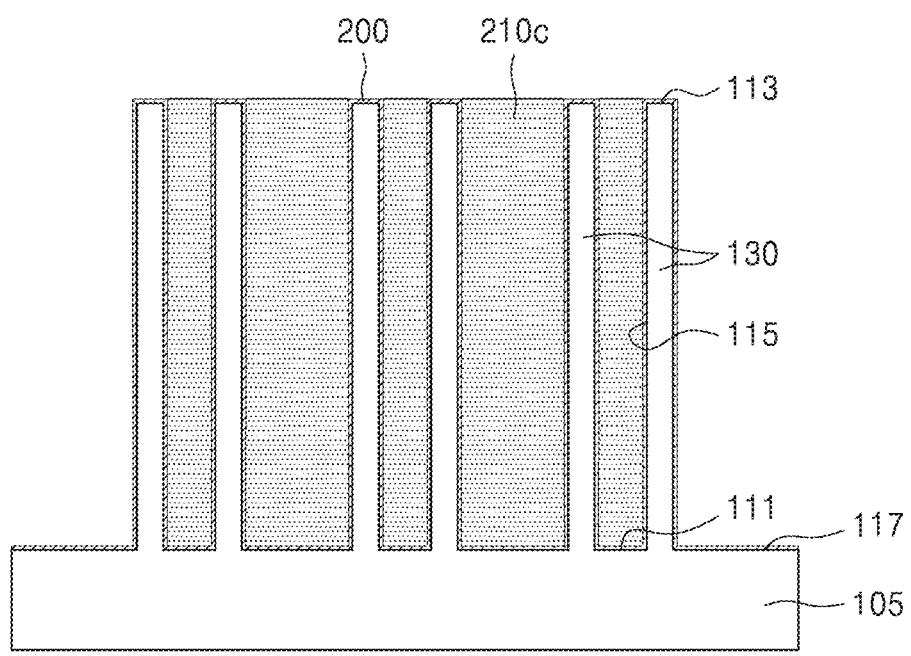

Referring to FIGS. 10A to 10C, semiconductor elements according to example embodiments may include a plurality of different materials filling one or more trenches. For brevity of description, only differences between FIGS. 4, 5, 7, and 9 will be described.

Referring to FIG. 10A, a semiconductor element according to an example embodiment may include the film 200 deposited in a trench 110, as described above in FIG. 4.

Additionally, the semiconductor element may further include a material 210a filling the trench 110. Unlike the material 210 described above in FIG. 5, the material 210a filling the trench 110 and the material of the film 200 may be different from each other. Also, the material 210a may be planarized after filling trench 110. The film 200 may be used as stop layer (e.g., etch stop, CMP stop) layer for planarizing the material 210a after filling the trench.

Referring to FIGS. 10B and 100, the films 200 illustrated in FIGS. 7 and 9 may be modified in a similar manner to provide materials 210b and 210c filling the trenches 121 and 131 of FIGS. 7 and 9, respectively. The materials 210b and 210c may be different than the material of the film 200. Also, the materials 210b and 210c may be planarized after filling the trenches 121 and 131 in FIGS. 7 and 9, respectively.

Also, as shown in FIGS. 10B and 10C, the material 210b and 210c may be etched to remove portions of the material 210b and 210c that otherwise would cover the third surface 117.

Examples of the materials 210a, 210b, and 210c may include any one of Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, $GaSe$, $GaTe_2$, $HfS_2$, $HFSe_2$, $SnSe$, $Pd_5e_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, $Bi_2O_2Se$, etc., provided the material of the film 200 is different than the material of the materials 210a, 210b, and 210c. For example, in some embodiments, the film 200 may be TiN, graphene, or TaN, and the materials 210a, 210b, and 210c may be a metal (e.g., W, Cu, Al) or metal alloy, but example embodiments are not limited thereto.

Figure 10D:
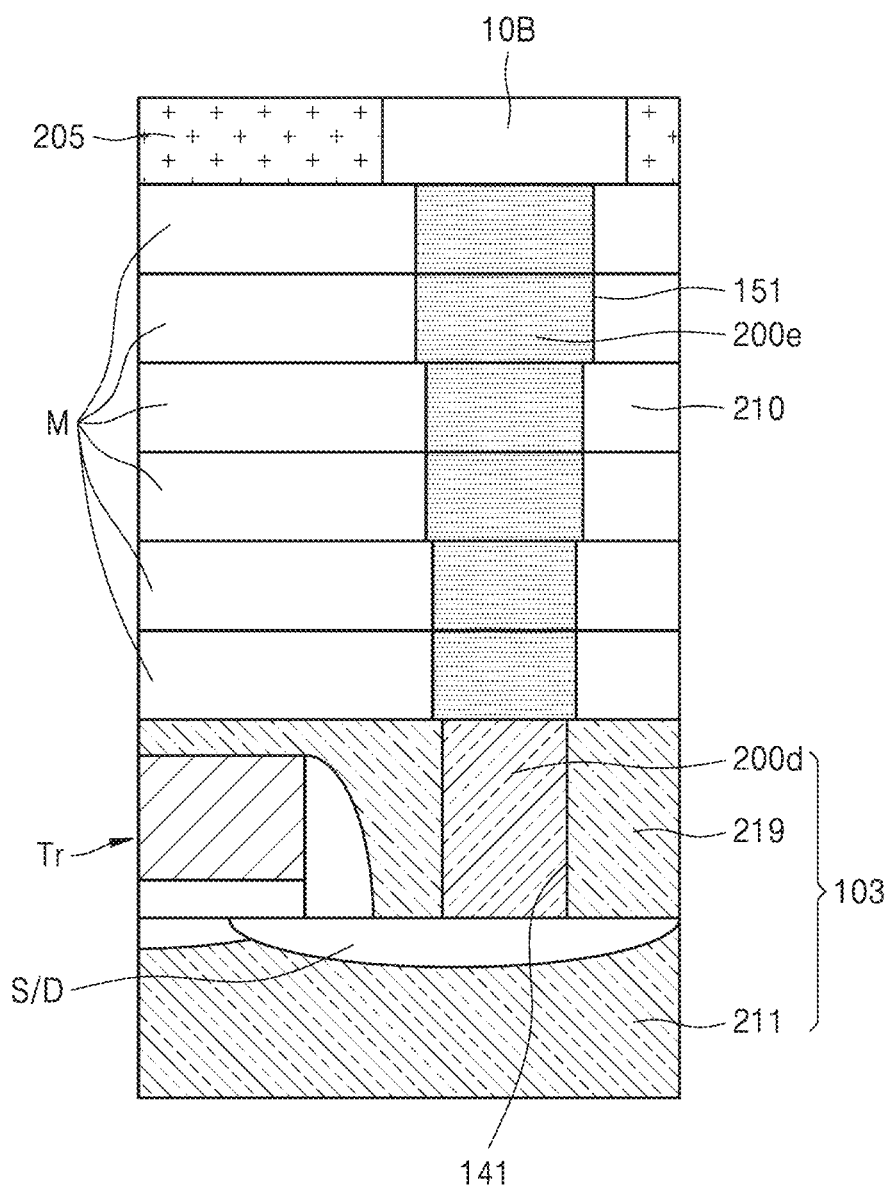

Referring to FIG. 10D, a semiconductor element according to example embodiments may include a non-planar substrate 103 including a transistor Tr on a semiconductor substrate 211 and a dielectric layer 219 covering the transistor Tr and the semiconductor substrate 211. The dielectric layer 219 may define a trench 141 that exposes the source/drain region S/D. A plurality of metallization layers ML may be formed on the dielectric layer 219 of the non-planar substrate 103. The metallization layers ML each may include a dielectric layer 210 with an opening 151 extending through the dielectric layer 210. An insulating film 205 may be formed on the metallization layers ML. The insulating film may include a circuit element 10B (e.g., resistor, capacitor) over the opening 105 in the metallization layers ML. Conductive materials 200e and 200d may be formed in the opening 151 and trench 141, respectively, to electrically connect the circuit element 10B to the source/drain region S/D in the semiconductor substrate 211. The conductive materials 200d and 200e may be formed using any one of the film deposition methods described above in FIGS. 1 to 9 and 10A to 10C. The conductive materials 200d and 200e may include one or more electrically conductive materials (e.g., Ta, Ti, Co, Ru, W, Cu, Mo, Al, RuMn, TiN, TaN), but example embodiments are not limited thereto.

Figure 10E:
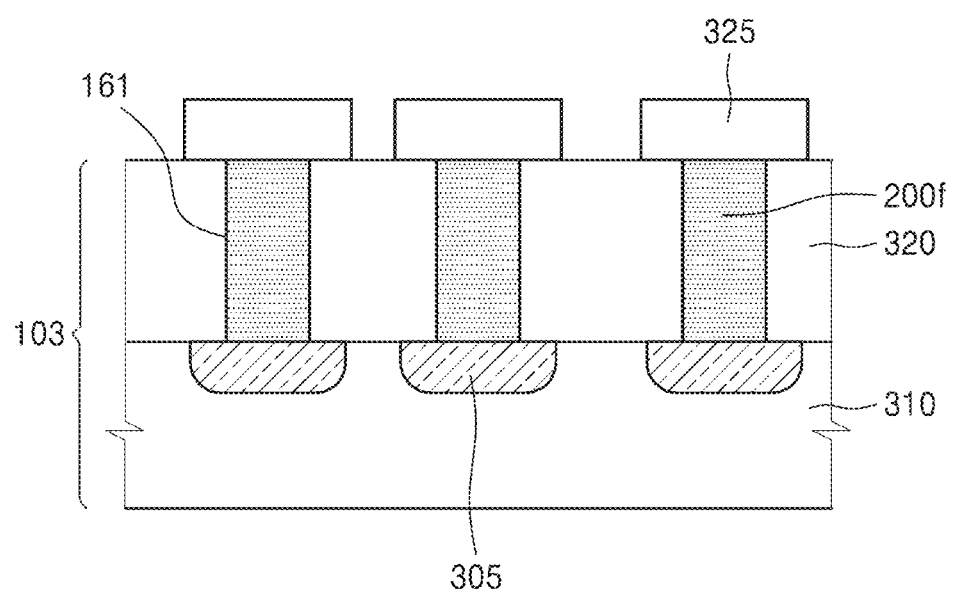

Referring to FIG. 10E, a semiconductor element according to example embodiments may include a non-planar substrate 103 including a semiconductor substrate 310 including device portions 305 spaced apart from each other, a dielectric layer 320 on the semiconductor substrate 310 and device portions 305, and electrodes 325 over the dielectric layers 320. The dielectric layers 320 may include trenches 161 between the electrodes 325 and device portions 305. Conductive materials 200f may be formed in the trenches 161, respectively, to electrically connect the electrodes 325 to the device portions 305. The conductive materials 200f may be formed using any one of the film deposition methods described above in FIGS. 1 to 9 and 10A to 10C. The conductive materials 200f may include one or more electrically conductive materials (e.g., Ta, Ti, Co, Ru, W, Cu, Mo, Al, RuMn, TiN, TaN), but example embodiments are not limited thereto. The device portion 305 may be part of a circuit (e.g., logic circuit, memory circuit, image sensor circuit).

In addition, the film deposition methods of example embodiments may be used for manufacturing various electric elements having microstructures in addition to being used for manufacturing the above-listed elements, and the various electric elements may be used as electronic devices or as part of electronic devices. Examples of the electronic devices may include display devices such as TVs, PCs, laptop computers, smart devices such as smartphones and tablets, wearable devices such as smartwatches, head mounted displays, head-up displays, augmented reality or virtual reality glasses, autonomous cars, etc.

As described above, according to the film deposition method of the one or more of the above example embodiments, a film may be uniformly deposited on a substrate having microstructures such as trench structures, pillar structures, or hollow structures by performing, at least once, a cycle including ALD and ALE.

Trenches included in microstructures such as trench structures, pillar structures, or hollow structures may be filled by the film deposition method of the one or more of the above example embodiments.

According to the film deposition methods of the above example embodiments, the occurrence of overhangs, electromigration, columnar structures, porous structures, and/or voids may be reduced; thus, the reliability of elements may be improved.

Elements including a film deposited by the film deposition method of the one or more of example embodiments may have satisfactory electrical characteristics and may be highly reliable.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A film deposition method comprising:
preparing a non-planar substrate comprising a first surface, a second surface and an inclined surface between the first surface and the second surface, a height of the second surface being different than a height of the first surface;
depositing a film having a thickness deviation on the first surface, the second surface, and the inclined surface, and wherein the depositing the film forms the film directly on the first surface, the second surface, and the inclined surface; and
etching the film deposited on the first surface, the second surface, and the inclined surface, wherein
after the etching of the film, the film is about 0.1 nm to about 100 nm thick on the first surface, the second surface, and the inclined surface,
wherein the depositing the film and the etching the film are included in one cycle, and the cycle is performed a plurality of times, and
wherein, after the cycle is performed a plurality of times,
a ratio of a thickness of the film on the first surface to a thickness of the film on the second surface is about 0.9 to about 1.1, and
a ratio of a thickness of the film on the inclined surface to the thickness of the film on the second surface is about 0.9 to about 1.1.

2. The film deposition method of claim 1, wherein after the depositing of the film, a thickness of the film deposited on the second surface is greater than a thickness of the film deposited on the first surface, and
an etching rate of the film on the second surface is greater than an etching rate of the film on the first surface.

3. The film deposition method of claim 1,
wherein the etching of the film is terminated when the thickness of the film on the first surface is about 0.9 times to about 1.1 times the thickness of the film deposited on the second surface.

4. The film deposition method of claim 1,
wherein, after the etching of the film,
a thickness of the film deposited on the first surface and a thickness of the film deposited on the second surface are equal to each other, or
a difference between the thickness of the film deposited on the first surface and the thickness of the film deposited on the second surface is about 10% or less of the thickness of the film deposited on the first surface.

5. The film deposition method of claim 1,
wherein, after the etching of the film,
a thickness of the film deposited on the first surface and a thickness of the film deposited on the inclined surface are equal to each other, or
a difference between the thickness of the film deposited on the first surface and the thickness of the film deposited on the inclined surface is about 10% or less of the thickness of the film deposited on the first surface.

6. The film deposition method of claim 1,
wherein the film comprises at least one selected from the group consisting of Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, GaSe, $GaTe_2$, $HfS_2$, $HFSe_2$, SnSe, $Pd_5e_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, and $Bi_2O_2Se$.

7. The film deposition method of claim 1,
wherein the depositing of the film is performed by at least one of atomic layer deposition (ALD), chemical vapor deposition (CVD), physical vapor deposition (PVD), and sputtering, and
the etching of the film is performed by at least one of atomic layer etching (ALE), reactive ion etching (RIE), and plasma etching in which an etching gas is injected.

8. The film deposition method of claim 1,
wherein, after the cycle is performed a plurality of times,
a thickness of the film deposited on the first surface and a thickness of the film deposited on the second surface are equal to each other.

9. The film deposition method of claim 1, wherein
the non-planar substrate includes a trench comprising the first surface and the inclined surface, and
while the cycle is performed a plurality of times, the trench is filled with a material.

10. The film deposition method of claim 9,
wherein the material comprises at least one selected from the group consisting of Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, GaSe, $GaTe_2$, $HfS_2$, $HFSe_2$, SnSe, $Pd_5e_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, and $Bi_2O_2Se$.

11. The film deposition method of claim 1,
wherein the non-planar substrate comprises at least one of a trench structure, a pillar structure, and a hollow structure.

12. The film deposition method of claim 1,
wherein an aspect ratio of the first surface and the inclined surface is about 0.5 to about 100.

13. A film deposition method comprising:
preparing a substrate comprising a micropattern;
forming a film on the micropattern, the film comprising a material; and
adjusting a thickness of the film to be equal to or less than a given distance from the micropattern,
wherein the given distance ranges from about 0.1 nm to about 100 nm, and
after the adjusting the thickness of the film, a ratio of a minimum thickness of the film and a maximum thickness of the film is within a range of about 0.9 to about 1.1, wherein the forming the film on the micropattern forms the film directly on the micropattern, wherein the forming of the film and the adjusting the thickness of the film are included in one cycle, and the cycle is performed a plurality of times.

14. The film deposition method of claim 13, wherein the film comprises at least one selected from the group consisting of Ta, Ti, Co, Ru, W, Cu, Mo, Al, RuMn, TiN, TaN, SiN, $WSi_x$, $AlO_x$, $HfO_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, GaSe, $GaTe_2$, $HfS_2$, $HFSe_2$, SnSe, $Pd_5e_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, and $Bi_2O_2Se$.

15. The film deposition method of claim 13, wherein the forming the film comprises is performed by at least one of atomic layer deposition (ALD), chemical vapor deposition (CVD), physical vapor deposition (PVD), and sputtering, and the adjusting the thickness is performed by at least one of atomic layer etching (ALE), reactive ion etching (RIE), and plasma etching in which an etching gas is injected.

16. The film deposition method of claim 13, wherein the micropattern comprises at least one selected from the group consisting of a trench structure, a pillar structure, and a hollow structure.

17. The film deposition method of claim 1, wherein the film comprises at least one selected from the group consisting of Cu, Mo, Al, SiN, $WSi_x$, germanium antimony telluride (GST), amorphous carbon, two-dimensional graphene, $MoS_2$, $MoSe_2$, $WS_2$, $WSe_2$, $WTe_2$, $PtS_2$, $PtSe_2$, $ZrS_2$, $ZrSe_2$, GaSe, $GaTe_2$, $HfS_2$, $HFSe_2$, SnSe, $Pd_5e_2$, $PtSe_2$, $PdTe_2$, $ReSe_2$, $VS_2$, $VSe_2$, $NbSe_2$, $FeSe_2$, $FeTe_2$, h-BN, a-BN, silicene, stanene, tellurene, borophene, antimonene, $Bi_2Se_3$, and $Bi_2O_2Se$.

* * * * *